United States Patent [19]
Ohta

[11] Patent Number: 5,245,579
[45] Date of Patent: Sep. 14, 1993

[54] SEMICONDUCTOR MEMORY DEVICE
[75] Inventor: Yoshiji Ohta, Ikoma, Japan
[73] Assignee: Sharp Kabushiki Kaishi, Osaka, Japan
[21] Appl. No.: 944,719
[22] Filed: Sep. 14, 1992

Related U.S. Application Data
[63] Continuation of Ser. No. 612,503, Nov. 14, 1990, abandoned.

Foreign Application Priority Data
Nov. 24, 1989 [JP] Japan .................. 1-304984

[51] Int. Cl.⁵ .............................................. G11C 7/00
[52] U.S. Cl. .................. 365/203; 365/189.05;
365/189.09; 365/189.11; 365/190; 365/204;
365/208; 365/230.06
[58] Field of Search ............. 365/203, 190, 207, 208,
365/205, 189.09, 230.06, 189.11, 204, 189.05

[56] References Cited
U.S. PATENT DOCUMENTS 4,701,888 10/1987 Yokouchi .................. 365/203
4,879,685 11/1989 Takemae ............. 365/189.11
4,956,819 9/1990 Hoffman et al. ............ 365/190
5,010,523 4/1991 Yamauchi ................ 365/203

Primary Examiner—Joseph E. Clawson, Jr.
Attorney, Agent, or Firm—Nixon & Vanderhye

[57] ABSTRACT

A semiconductor memory device for storing data includes a plurality of cells (4) aligned horizontally and vertically; first bit lines (BL) connected to cells occurring in odd number locations of vertically aligned cells; second bit lines (BL#) connected to cells occurring in the even number locations of the vertically aligned cells; writing circuits (2); a precharge circuit (6); and, a writing control circuit (1). The writing circuit (2) simultaneously charges one of the bit lines to a predetermined voltage and maintains the other of the bit lines at a precharge voltage level. The write circuit control means (1) controls which of the bit lines is to be charged to the predetermined voltage level and which of the bit lines is to be maintained at the precharge voltage level, whereby common data is written to all memory cells (4) in a row when a word signal is activated on a word line connected to the row.

12 Claims, 2 Drawing Sheets

SEMICONDUCTOR MEMORY DEVICE

This is a continuation of application Ser. No. 07/612,503, filed Nov. 14, 1990, now abandoned.

BACKGROUND OF THE INVENTION

1. Field of the Invention

1a. Related Application

This application is related to the commonly assigned copending application of Ota and Ochiai entitled "Semiconductor Memory Device Having a Memory Test Circuit" filed Nov. 21, 1990 and assigned Ser. No. 07/616,923.

The present invention relates to a semiconductor memory device with a quick writing operation of data supplied externally.

2. Description of the Prior Art

Recently, the development of the semiconductor devices has been increasingly promoted. Particularly, in the last three years, the integration density of RAMs, ROMs and other memory chips has been increased as much as four times, and thus the operating speed is increased as well. The speed up of the operation time is still in demand, particularly of CPU or memory for image processing.

Under such circumstances, in the field of DRAM, a number of quick serial access modes for sending one line data, such as fast page mode, statistic column mode, extended nibble mode are proposed.

However, these proposed modes are serial access modes and are not as fast as the parallel access mode.

SUMMARY OF THE INVENTION

The present invention has been developed with a view to substantially solving the above described disadvantages and has for its essential object to provide an improved semiconductor memory device which can have a parallel access to one line for writing the same data, such as a test data, to enable the increase of the operation speed.

In order to achieve the aforementioned objective, a semiconductor memory device for storing data according to the present invention comprises a plurality of cells aligned horizontally and vertically; first bit line means connected to cells occurring in the odd number locations of the vertically aligned cells; second bit line means connected to cells occurring in the even number locations of the vertically aligned cells; first gate means for providing a predetermined voltage to said first bit line means when said first gate means is enabled; second gate means for providing a predetermined voltage to said second bit line means when said second gate means is enabled; a gate control means for controlling said first and second gate means such that said first gate means is enabled when said data is in a first level, and said second gate means is enabled when said data is in a second level; and a word line connected to cells aligned in one horizontal line for simultaneously storing, when said word line is activated, said predetermined voltage from said first bit line in the cells connected to said word line.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
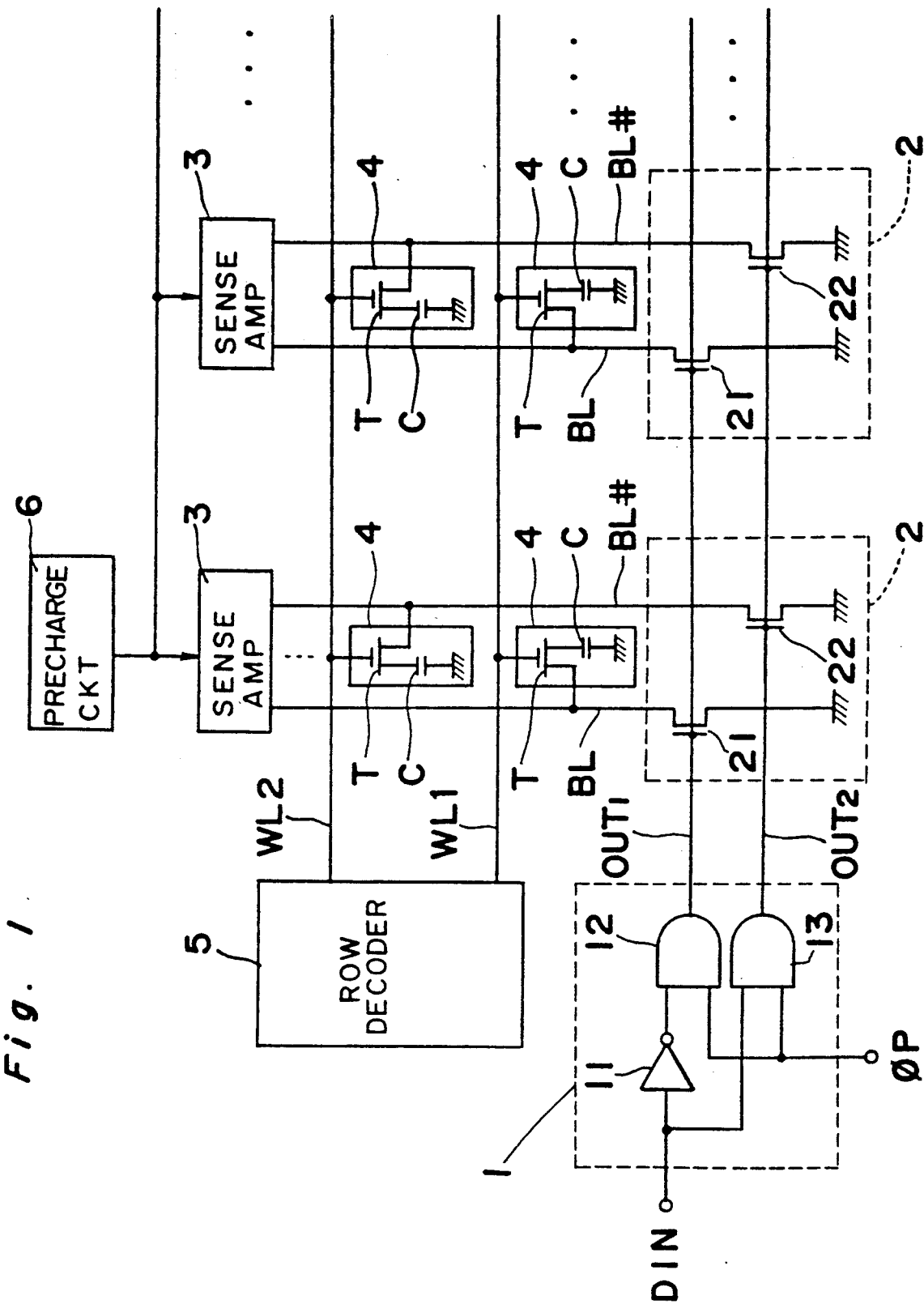
FIG. 1 is a circuit diagram of one cell of a semiconductor memory device according to a first embodiment of the present invention.

Referring to FIG. 1, a semiconductor memory device according to a first embodiment of the present invention is shown for effecting the parallel writing of one line in a DRAM. In FIG. 1, reference number 1 is a writing control circuit, 2 is a writing circuit, 3 is a sense amplifier, and 4 is a memory cell formed by a switching transistor T and a capacitor C, 5 is a row decoder, and 6 is a precharge circuit. There are a plurality of cells 4 aligned vertically and horizontally.

Writing control unit 1 has inverter 11 and AND gates 12 and 13. A write control signal $\phi p$ is applied to each of AND gates 12 and 13, and input signal DIN is applied to AND gate 13 directly and also to AND gate 12 through inverter 11.

Writing circuit 2 includes NMOS transistors 21 and 22 which are so connected to make and break bit lines BL and BL#, respectively, in response to the data from AND gates 12 and 13. The gates of transistors 21 and 22 are connected to output terminals of AND gates 12 and 13, respectively. Bit lines BL and BL# are in pair and are also connected to sense amplifier 3 and further to precharge circuit 6. The cells aligned in the bottom line are connected to bit line BL, and the cells aligned in the penultimate line are connected to bit line BL#. In this manner, the cells aligned in the even lines are connected to bit line BL, and the cells aligned in the odd lines are connected to bit line BL#, or vice versa. Furthermore, the cells 4 aligned horizontally in the bottom line are connected to a word line WL1 extending from row decoder 5, and similarly the cells in the penultimate line are connected to a word line WL2.

In operation, under the precharge condition, precharge circuit 6 provides a precharge voltage, such as $\frac{1}{2}Vcc$, to each of bit lines BL and BL# and, at the same time, the write control signal $\phi p$ is maintained in LOW level. Thus, output signals OUT1 and OUT2 from AND gates 12 and 13 are both LOW level signals. Thus, NMOS transistors 21 and 22 are both in non-conducting condition, maintaining the bit lines BL and BL# in the precharge voltage.

Then, when the writing operation starts, input signal DIN changes between HIGH level signal and LOW level signal in accordance with the input signal. Thereafter, when the write control signal $\phi p$ is changed to HIGH level signal, the input signal DIN is transmitted through AND gate 13 and is applied to transistors 22 as output signal OUT2, and at the same time, the inverse of the input signal DIN is transmitted through AND gate 12 and is applied to transistors 21 as output signal OUT1. It is now assumed that the input signal DIN is a HIGH level signal. Thus, transistors 22 turn on to provide a ground level to bit line BL# and, at the same time, transistor 21 turn off to maintain the bit line BL in the precharge voltage.

Thereafter, when the word line WL1 provides a HIGH level signal, transistors T in the cells in the bottom line turn on to permit the charging of capacitors C in the bottom line by the respective bit lines BL. According to the above example, since bit lines BL are at the precharge level, capacitors C in the bottom line are simultaneously charged to a HIGH (precharge) level. Then, when the word line WL1 provides a LOW level signal, the capacitors C in the bottom line maintain the charged condition, in this case to the HIGH level.

Similarly, when the next word line WL2 provides a HIGH level signal, transistors T in the cells in the penultimate line turn on to permit the charging of capacitors C in the penultimate line by the respective bit lines BL#. According to the above example, since bit lines BL# are at the ground level, capacitors C in the penultimate line are simultaneously charged to a LOW level. Then, when the word line WL2 provides a LOW level signal, the capacitors C in the penultimate line maintain the charged condition, in this case to the LOW level.

In order to increase the charging level in the respective capacitors C, sense amplifiers 3 can be operated while a word line WL is held HIGH to amplify the precharge level.

By the above operation, the cells 4 in one line can be written with a common data simultaneously. In other words, according to the present invention, it is possible to have a parallel access to the cells in one line.

Figure 2:
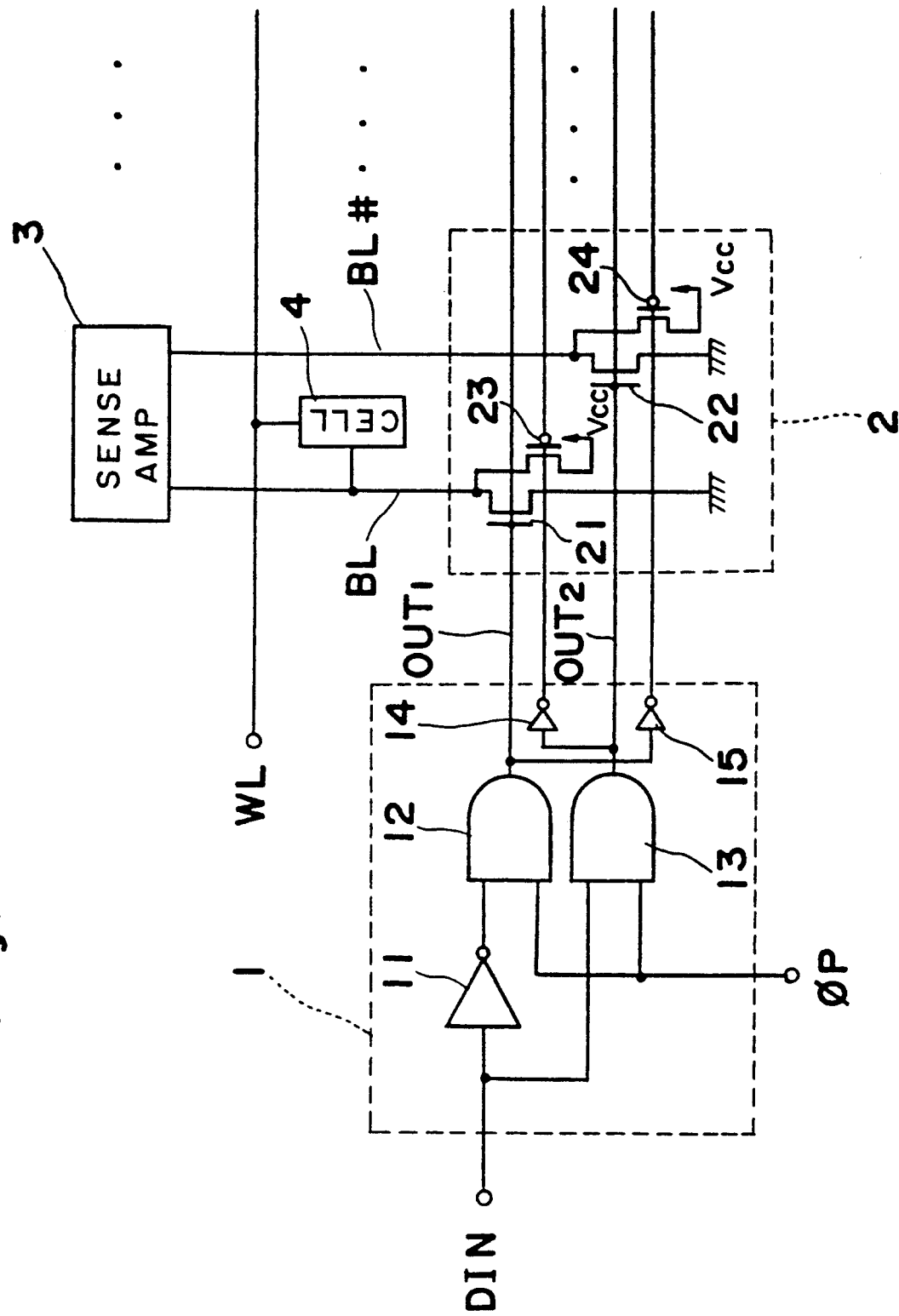
FIG. 2 is a circuit diagram of one cell of a semiconductor memory device according to a second embodiment of the present invention.

Referring to FIG. 2, a semiconductor memory device according to the second embodiment of the present invention is shown.

Writing control unit 1 further has inverters 15 and 14 connected to AND gates 12 and 13, respectively. Furthermore, writing circuit 2 further has PMOS transistors 23 and 24 which are connected to inverters 14 and 15, respectively. PMOS transistors are provided with a predetermined voltage, such as Vcc.

In operation, when the input signal DIN is a HIGH level signal with AND gates 12 and 13 being enabled, AND gates 12 and 13 produces LOW level signal and HIGH level signal, respectively. Thus, inverters 14 and 15 produces LOW level signal and HIGH level signal, respectively. Thus, transistor 21 turns off and transistor 23 turns on to provide bit line BL with the predetermined voltage Vcc. Also, transistor 22 turns on and transistor 24 turns off to provide bit line BL# with the ground level.

Thus, according to the second embodiment, the capacitors C can be charged with a desired level Vcc without any amplification by the sense amplifier.

In any of the above embodiments, it is possible to change the logic circuit of writing control unit 1 and writing circuit 2. For example, AND gates 12 and 13 can be replaced with OR gates with the write control signal $\phi p$ being in the inverted form. Furthermore, NMOS transistors 21 and 22 can be replaced with PMOS transistors, and the bit lines BL and BL# being connected to Vcc level instead of ground level.

Thus, according to the present invention, the same data can be stored simultaneously in cells aligned in one horizontal line, thus enabling quick access. Accordingly, the test time can be shortened.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor memory device comprising:
   a plurality of memory cells aligned vertically and horizontally;
   a plurality of first bit lines each connected to memory cells occurring in even number locations of vertically aligned memory cells;
   a plurality of second bit lines each connected to memory cells occurring in odd number locations of vertically aligned memory cells;
   a plurality of word lines each connected to memory cells aligned horizontally;
   first voltage source means for producing a first voltage level;
   second voltage source means for producing a second voltage level other than said first voltage level;
   charge switching means connected to the first bit lines and the second bit lines for switching between a first condition in which the first bit lines are simultaneously charged to said first voltage level and, at the same time, the second bit lines are simultaneously charged to said second voltage level, and a second condition in which the first bit lines are simultaneously charged to said second voltage level and, at the same time, the second bit lines are simultaneously charged to said first voltage level;
   switch control means for controlling which one of the first and second conditions is to be set in said charge switching means; and
   activation signal producing means for producing an activation signal to at least one of said plurality of word lines, whereby either one of the first voltage level or the second voltage level is simultaneously written to all memory cells aligned horizontally when said one word line receives the activation signal;
   wherein said charge switching means comprises a first transistor and a second transistor, the first transistor having first and second terminals connected between said first and second voltage source means through said first bit line and a gate connected to said switch control means, the second transistor having first and second terminals connected between said first and second voltage source means through said second bit line and a gate connected to said switch control means.

2. A semiconductor memory device as claimed in claim 1, wherein said first voltage source means is a precharge circuit means and wherein said first voltage level is a precharge voltage level.

3. A semiconductor memory device is claimed in claim 1, wherein said second voltage source means is a ground and wherein said second voltage level is a ground voltage level.

4. A semiconductor memory device as claimed in claim 1, wherein said switch control means comprises a first logic gate having an output terminal connected to the first transistor and a second logic gate having an output terminal connected to a second transistor, the first logic gate and the second logic gate both having first input terminals connected to receive a switch enable signal, the first logic gate having an input terminal connected to receive an inverted control signal and the second logic gate having an input terminal connected to receive a control signal.

5. A semiconductor memory device as claimed in claim 1, wherein said first voltage source means is a reference voltage circuit means and wherein said first voltage level is a reference voltage level.

6. A semiconductor memory comprising:
- a plurality of memory cells aligned vertically and horizontally;
- a plurality of first bit lines each connected to memory cells occurring in even number locations of vertically aligned memory cells;
- a plurality of second bit lines each connected to memory cells occurring in odd number locations of vertically aligned memory cells;
- a plurality of word lines each connected to memory cells aligned horizontally;
- first voltage source means for producing a first voltage level;
- second voltage source means for producing a second voltage level other than said first voltage level;
- charge switching means connected to the first bit lines and the second bit lines for switching between a first condition in which the first bit lines are simultaneously charged to said first voltage level and, at the same time, the second bit lines are simultaneously charged to said second voltage level, and a second condition in which the first bit lines are simultaneously charged to said second voltage level and, at the same time, the second bit lines are simultaneously charged to said first voltage level;
- switch control means for controlling which one of the first and second conditions is to be set in said charge switching means; and
- activation signal producing means for producing an activation signal to at least one of said plurality of word lines, whereby either one of the first voltage level or the second voltage level is simultaneously written to all memory cells aligned horizontally when said one word line receives the activation signal;
- wherein said charge switching means comprises:
  - a first transistor and a third transistor, the first transistor having first and second terminals connected between said first bit line and said second voltage source means and a gate connected to said switch control means, the third transistor having first and second terminals connected between said first voltage source means and said first bit line and a gate connected to said switch control means;
  - a second transistor and a fourth transistor, the second transistor having first and second terminals connected between said second bit line and said second voltage source means and a gate connected to said switch control means, the fourth transistor having first and second terminals connected between said first voltage source means and said second bit line and a gate connected to said switch control means.

7. A semiconductor memory device as claimed in claim 1, wherein said switch control means comprises: a first logic gate having an output terminal connected to the first transistor and also through an invertor to the third transistor; and a second logic gate having an output terminal connected to the second transistor and also through an invertor to the fourth transistor, the first logic gate and the second logic gate both having first input terminals connected to receive a switch enable signal, the first logic gate having an input terminal connected to receive an inverted control signal and the second logic gate having an input terminal connected to receive a control signal.

8. A semiconductor memory device as claimed in claim 6, wherein said first voltage source means is a precharge circuit means and wherein said first voltage level is a precharge voltage level.

9. A semiconductor memory device as claimed in claim 6, wherein said second voltage source means is a ground and wherein said second voltage level is a ground voltage level.

10. A semiconductor memory device as claimed in claim 6, wherein said switch control means comprises a first logic gate having an output terminal connected to the first transistor and a second logic gate having an output terminal connected to the second transistor, the first logic gate and the second logic gate both having first input terminals connected to receive a switch enable signal, the first logic gate having an input terminal connected to receive an inverted control signal and the second logic gate having an input terminal connected to receive a control signal.

11. A semiconductor memory device as claimed in claim 6, wherein said first voltage source means is a reference voltage circuit means and wherein said first voltage level is a reference voltage level.

12. A semiconductor memory device as claimed in claim 6, wherein said switch control means comprises a first logic gate having an output terminal connected to the first transistor and also through an invertor to the third transistor; and a second logic gate having an output terminal connected to the second transistor and also through an invertor to the fourth transistor, the first logic gate and the second logic gate both having first input terminals connected to receive a switch enable signal, the first logic gate having an input terminal connected to receive an inverted control signal and the second logic gate having an input terminal connected to receive a control signal.

* * * * *